United States Patent
Cao

(10) Patent No.: US 9,215,359 B2
(45) Date of Patent: Dec. 15, 2015

(54) ANTISTATIC DEVICE AND ELECTRONIC DEVICE WITH THE SAME

(71) Applicant: ShenZhen Treasure City Technology Co., LTD., Shenzhen (CN)

(72) Inventor: Yan-Bang Cao, Shenzhen (CN)

(73) Assignee: ShenZhen Treasure City Technology Co., LTD., ShenZhen (CN)

( * ) Notice: Subject to any disclaimer, the term of this patent is extended or adjusted under 35 U.S.C. 154(b) by 0 days.

(21) Appl. No.: 14/524,715

(22) Filed: Oct. 27, 2014

(65) Prior Publication Data

US 2015/0215502 A1 Jul. 30, 2015

(30) Foreign Application Priority Data

Jan. 24, 2014 (CN) .......................... 2014 1 0033016

(51) Int. Cl.
| | |
|---|---|
| H01L 23/48 | (2006.01) |
| H01L 23/52 | (2006.01) |
| G03B 17/00 | (2006.01) |
| G03B 17/02 | (2006.01) |
| H04N 5/225 | (2006.01) |
| H05F 3/00 | (2006.01) |
| H05K 9/00 | (2006.01) |
| H01L 23/60 | (2006.01) |

(52) U.S. Cl.
CPC .............. *H04N 5/2252* (2013.01); *H01L 23/60* (2013.01); *H05F 3/00* (2013.01); *H05K 9/0067* (2013.01); *H01L 2924/302* (2013.01); *H01L 2924/3025* (2013.01)

(58) Field of Classification Search
CPC ................. H01L 2924/302; H01L 2924/3025; H01L 23/60
USPC .................................... 257/692; 396/542, 535
See application file for complete search history.

(56) References Cited

U.S. PATENT DOCUMENTS

| | | | |
|---|---|---|---|
| 2010/0247086 A1* | 9/2010 | Tallaron .................. | G02B 3/14 396/133 |
| 2015/0015954 A1* | 1/2015 | Baik ........................ | G02B 7/08 359/507 |

* cited by examiner

*Primary Examiner* — Karen Kusumakar
(74) *Attorney, Agent, or Firm* — Novak Druce Connolly Bove + Quigg LLP

(57) ABSTRACT

An antistatic device includes a main body, a first conductive member, and a second conductive member. The main body with a first surface has a first annular groove and a second surface, opposite the first surface, has a second annular groove. The first conductive member, with a first end is in contact with a camera assembly of an electronic device and a second end, opposite the first end, is positioned in the first annular groove. The second conductive member, with a first end is positioned in the second annular groove and a second end, opposite the first end, is in contact with the conductive potion of a housing of the electronic device. Static electricity from the camera assembly is conducted from the camera assembly through the first conductive member to the main body and from the main body through the second conductive member to the conductive portion of the housing.

13 Claims, 3 Drawing Sheets

ANTISTATIC DEVICE AND ELECTRONIC DEVICE WITH THE SAME

CROSS-REFERENCE TO RELATED APPLICATIONS

This application claims priority to Chinese Patent Application No. 201410033016.2 filed on Jan. 24, 2014, the contents of which are incorporated by reference herein.

FIELD

The subject matter herein generally relates to antistatic devices, and particularly, to an antistatic device capable of conducting static electricity of a camera assembly from the camera assembly.

BACKGROUND

Cameras are widely employed in many fields, such as image capturing and secure monitoring. And the cameras may accumulate redundant static electricity after the cameras contact electronic devices.

BRIEF DESCRIPTION OF THE DRAWINGS

Implementations of the present technology will now be described, by way of example only, with reference to the attached figures.

DETAILED DESCRIPTION

Figure 1:
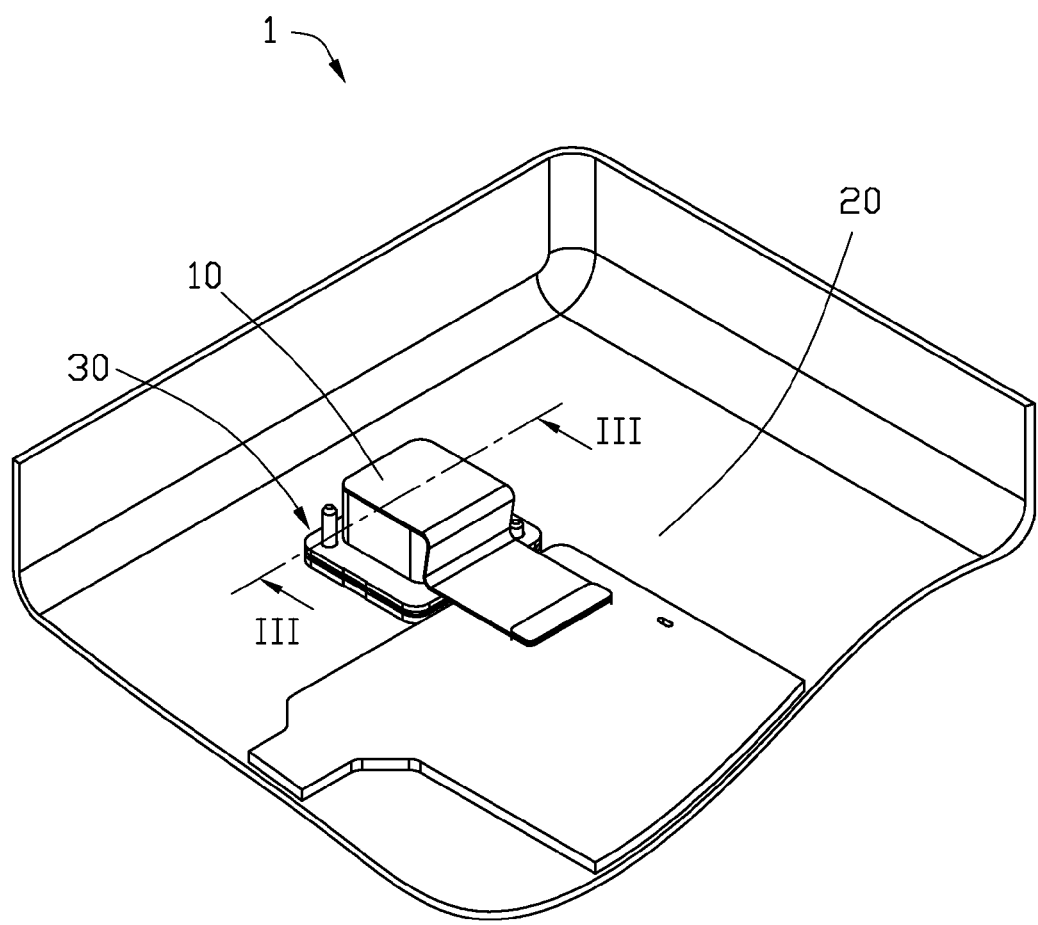
FIG. 1 is an isometric view of a part of an embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

A definition that applies throughout this disclosure will now be presented.

The term "comprising" means "including, but not necessarily limited to"; it specifically indicates open-ended inclusion or membership in a so-described combination, group, series and the like.

Embodiments of the present disclosure will be described with reference to the accompanying drawings.

FIG. 1 illustrates an embodiment of an electronic device 1. The electronic device 1 can include a camera assembly 10, a housing 20, and an antistatic device 30. The housing 20 defines an interior space 21 with an interior surface 22. At least a portion of the housing 20 includes conductive material. The camera assembly 10 and the antistatic device 30 are positioned within the interior space 21. The antistatic device 30 is arranged between the camera assembly 10 and the interior surface 22. The antistatic device 30 can conduct static electricity from the camera assembly 10 to the conductive portion of the housing 20. Usually, the housing 20 is placed on a desk, or a ground, or is held by a person, the static electricity can be directly or indirectly conducted from the housing 20 to the ground, thus the antistatic device 30 can conduct the static electricity of the camera assembly 10 to the ground.

Figure 2:
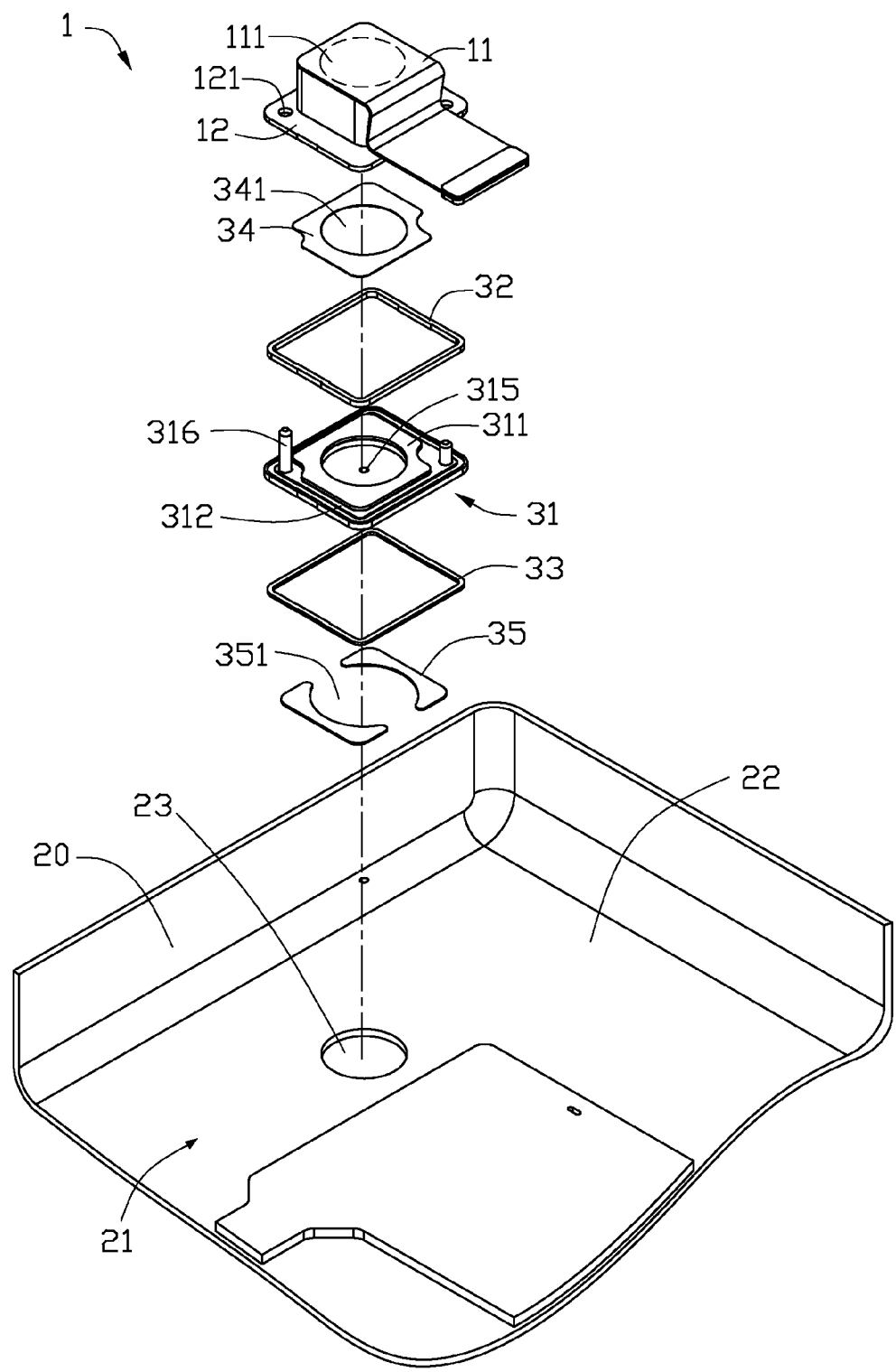
FIG. 2 is an exploded, isometric view of the electronic device of FIG. 1.
Figure 3:
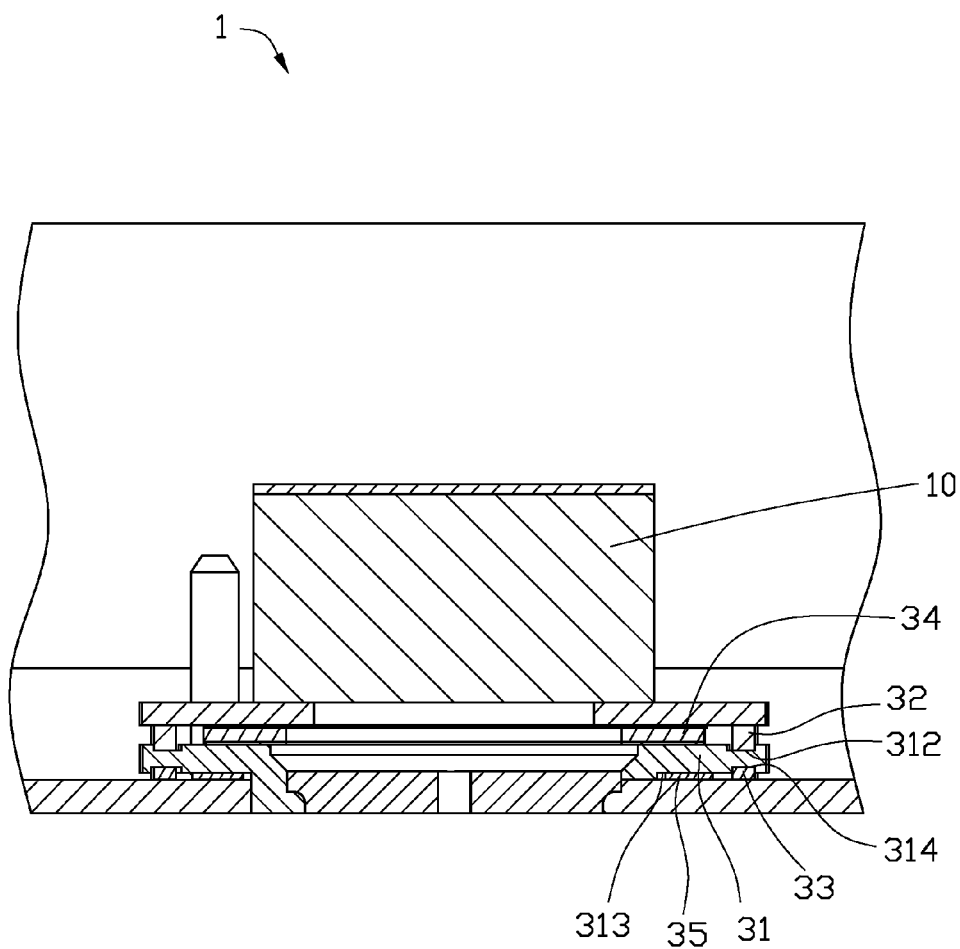
FIG. 3 is a cross-sectional view taken along line III-III of FIG. 1.

FIGS. 2-3 illustrate a detailed structure of the electronic device 1. In the embodiment, the housing 20 defines a first through hole 23. The antistatic device 30 can include a main body 31, a first conductive member 32, and a second conductive member 33. The main body 31 is arranged between the camera assembly 10 and the housing 20. A first surface 311 of the main body 31 defines a first annular groove 312 to receive a portion of the first conductive member 32, and a second surface 313 of the main body 31 defines a second annular groove 314 to receive a portion of the second conductive member 33. The second surface 313 of the main body 31 is opposite to the first surface 312 of the main body 31. The main body 31 defines a second through hole 315 co-axial with the first through hole 23. In the embodiment, the main body 31 is made of a conductive material.

The first conductive member 32 is arranged between the camera assembly 10 and the first surface 311 of the main body 31. A first end of the first conductive member 32 is in contact with the camera assembly 10, and a second end of the first conductive member 32 is positioned in the first annular groove 312 of the main body 31. The second end of the first conductive member 32 is opposite to the first end of the first conductive member 32. The first conductive member 32 can conduct the static electricity of the camera assembly 10 from the camera assembly 10 to the main body 31. In the embodiment, the first conductive member 32 is annular conductive foam.

The second conductive member 33 is arranged between the second surface 313 of the main body 31 and the housing 20. A first end of the second conductive member 33 is positioned in the second annular groove 314 of the main body 31, and a second end of the second conductive member 33 is in contact with the conductive portion of the housing 20. The second end of the second conductive member 33 is opposite to the first end of the second conductive member 33. The second conductive member 33 can conduct the static electricity from the main body 31 to the conductive portion of the housing 20. In the embodiment, the second conductive member 33 also can be the annular conductive foam. Thus, the static electricity of the camera assembly 10 can be conducted to the ground via the antistatic device 30.

In the embodiment, the antistatic device 30 can include a first fixing member 34 and a second fixing member 35. The first fixing member 34 is arranged between the camera assembly 10 and the main body 31, and is parallel with the first conductive member 32. The first fixing member 34 can attach the camera assembly 10 to the main body 31. The first fixing member 34 defines a third through hole 341 co-axial with the first through hole 23. In the embodiment, the first fixing member 34 is an adhesive tape. The second fixing member 35 is arranged between the main body 31 and the housing 20, and is parallel with the second conductive member 33. The second fixing member 35 can attach the main body 31 to the housing 20. In the embodiment, the second fixing member 35 define a fourth through hole 351 co-axial with the first through hole 23. In the embodiment, the second fixing member 35 also can be the adhesive tape.

In the embodiment, the camera assembly 10 can include a camera 11 and a positioning plate 12. In the embodiment, the camera 11 defines an aperture 111 in the center. The first through hole 23 is co-axial with the aperture 111. Thus, when the camera 11 captures images, an amount of light can enters the camera 11 through the first through hole 23, the second through hole 315, the third through hole 341, the fourth through hole 351, and the aperture 11. The camera 11 is fixed to the positioning plate 12. At least one corner of the positioning plate 12 defines one positioning hole 121. In the embodiment, two positioning holes 121 are employed as an example. The main body 31 includes at least one positioning pole 316. In the embodiment, two positioning poles 316 are employed as an example. Each positioning pole 316 protrudes from one corresponding corner of the first surface 311 of the main body 31. Each positioning pole 316 extends through a corresponding positioning hole 121 to fix the camera 11 to the main body 31.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. An antistatic device comprising:
    a main body with a first surface having a first annular groove and a second surface with a second annular groove, the second surface opposite the first surface;
    a first conductive member, with a first end configured to be in contact with a camera assembly of an electronic device and a second end, opposite the first end, positioned in the first annular groove; and
    a second conductive member, with a first end positioned in the second annular groove and a second end, opposite the first end, being configured to be in contact with the conductive potion of a housing of the electronic device; and
    wherein, static electricity from the camera assembly is conducted from the camera assembly through the first conductive member to the main body and from the main body through the second conductive member to the conductive portion of the housing.

2. The antistatic device as described in claim 1, wherein the first conductive member and the second conductive member are annular conductive foams.

3. The antistatic device as described in claim 1, wherein the main body is made of a conductive material.

4. The antistatic device as described in claim 1, further comprising a first fixing member and a second fixing member, wherein the first fixing member is configured to be arranged between the camera assembly and the main body, and is parallel with the first conductive member, and the first fixing member is configured to attach the camera assembly to the main body; and the second fixing member is configured to be arranged between the main body and the conductive portion of the housing, and is parallel with the second conductive member, and the second fixing member is configured to attach the main body to the conductive portion of the housing.

5. The antistatic device as described in claim 4, wherein the first fixing member and the second fixing member are adhesive tapes.

6. The antistatic device as described in claim 1, wherein the main body comprising at least one positioning pole, each of the at least one positioning pole protrudes from one corresponding corner of the first surface of the main body, each of the at least one positioning pole is configured to pass through a corresponding positioning hole of the camera assembly, fixing the camera assembly to the main body.

7. A camera with an antistatic device comprising:
    a housing defining an interior space with an interior surface, with at least a portion of the housing comprising conductive material;
    a camera assembly positioned within the interior space; and
    an antistatic device positioned within the interior space between the camera assembly and the interior surface and in contact with the conductive portion of the housing;
    wherein, the antistatic device comprises:
        a main body with a first surface having a first annular groove and a second surface with a second annular groove, the second surface opposite the first surface
        a first conductive member, with a first end in contact with the camera assembly and a second end, opposite the first end, positioned in the first annular groove; and
        a second conductive member, with a first end positioned in the second annular groove and a second end, opposite the first end, in contact with the conductive potion of the housing; and
    wherein, static electricity from the camera assembly is conducted from the camera assembly through the first conductive member to the main body and from the main body through the second conductive member to the conductive portion of the housing.

8. The electronic device as described in claim 7, wherein the first conductive member and the second conductive member are annular conductive foams.

9. The electronic device as described in claim 7, wherein the main body is made of a conductive material.

10. The electronic device as described in claim 7, wherein the antistatic device further comprises a first fixing member and a second fixing member; the first fixing member is arranged between the camera assembly and the main body, and is parallel with the first conductive member, and the first fixing member attaches the camera assembly to the main body; and the second fixing member is arranged between the main body and the conductive portion of the housing, and is parallel with the second conductive member, and the second fixing member attaches the main body to the conductive portion of the housing.

11. The electronic device as described in claim 10, wherein the first fixing member and the second fixing member are adhesive tapes.

12. The electronic device as described in claim 7, wherein the camera assembly comprises a camera and a positioning plate fixed to the camera, at least one corner of the positioning plate defines one positioning hole; the main body comprises at least one positioning pole, each of the at least one positioning pole protrudes from one corresponding corner of the first surface of the main body; each of the at least one positioning pole extends through a corresponding positioning hole to fix the camera to the main body.

13. The electronic device as described in claim 12, wherein the camera defines an aperture in the center, the first through hole is co-axial with the aperture.

* * * * *